(12) United States Patent
Lu

(10) Patent No.: US 8,604,882 B2
(45) Date of Patent: Dec. 10, 2013

(54) SINGLE-ENDED TO DIFFERENTIAL AMPLIFIER

(75) Inventor: Eric Chiyuan Lu, San Jose, CA (US)

(73) Assignee: Ralink Technology Corporation, Jhubei (TW)

( * ) Notice: Subject to any disclaimer, the term of this patent is extended or adjusted under 35 U.S.C. 154(b) by 0 days.

(21) Appl. No.: 13/197,683

(22) Filed: Aug. 3, 2011

(65) Prior Publication Data

US 2013/0033312 A1  Feb. 7, 2013

(51) Int. Cl.
*H03F 3/04* (2006.01)
*H03F 3/45* (2006.01)

(52) U.S. Cl.
USPC ............................................. 330/301; 330/69

(58) Field of Classification Search
USPC ........................................ 330/301, 310, 311
See application file for complete search history.

(56) References Cited

U.S. PATENT DOCUMENTS

| 3,025,414 A * | 3/1962 | McVey | 327/346 |
| 2006/0164171 A1 * | 7/2006 | Wu | 330/301 |

\* cited by examiner

*Primary Examiner* — Robert Pascal
*Assistant Examiner* — Khiem Nguyen
(74) *Attorney, Agent, or Firm* — Sawyer Law Group, P.C.

(57) ABSTRACT

A circuit for single ended to differential conversion is disclosed. The circuit comprises a source for providing a single ended signal; and a transformer for receiving the single ended signal. The transformer includes first and second inductors. The first and second inductors are mutually coupled. When the operating frequency changes, a phase difference of currents flowing through the inductors changes, and therefore a phase difference between effective impedance of the first and second inductors changes to maintain a substantially 180 degree phase difference due to the mutual coupling.

8 Claims, 8 Drawing Sheets

SINGLE-ENDED TO DIFFERENTIAL AMPLIFIER

FIELD OF THE INVENTION

The present invention relates generally to integrated circuits and more particularly to differential amplifiers utilized in such circuits.

BACKGROUND OF THE INVENTION

There are many instances in integrated circuits where single ended signals must be converted to differential signals. For example in some circuits where an antenna is utilized, the signal from the antenna is single ended but the signal is then converted on the circuit into a differential signal. Typically, a differential amplifier is utilized for such a purpose. It is always desirable to reduce the cost and size of the circuit and typically since the differential amplifier contributes to the cost and size of the circuit it is desirable to provide improvements that address these concerns.

Accordingly, what is desired is a system and method that addresses the above-identified issues. The system and method should be cost effective, easily implemented and adaptable to existing systems. The present invention addresses such a need.

SUMMARY OF THE INVENTION

A circuit for single ended to differential conversion is disclosed. The circuit comprises a source for providing a single ended signal; and a transformer for receiving the single ended signal. The transformer includes first and second inductors. The first and second inductors are mutually coupled. When the operating frequency changes, a phase difference of currents flowing through the inductors changes, and therefore a phase difference between effective impedance of the first and second inductors changes to maintain a substantially 180 degree phase difference due to the mutual coupling.

Compared to conventional circuits, a circuit in accordance with an embodiment offers less front-end loss and smaller device size within a certain area. Furthermore, the circuit is relatively insensitive to parasitic at transformer outputs.

DETAILED DESCRIPTION

The present invention relates generally to integrated circuits and more particularly amplifiers utilized in such circuits. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
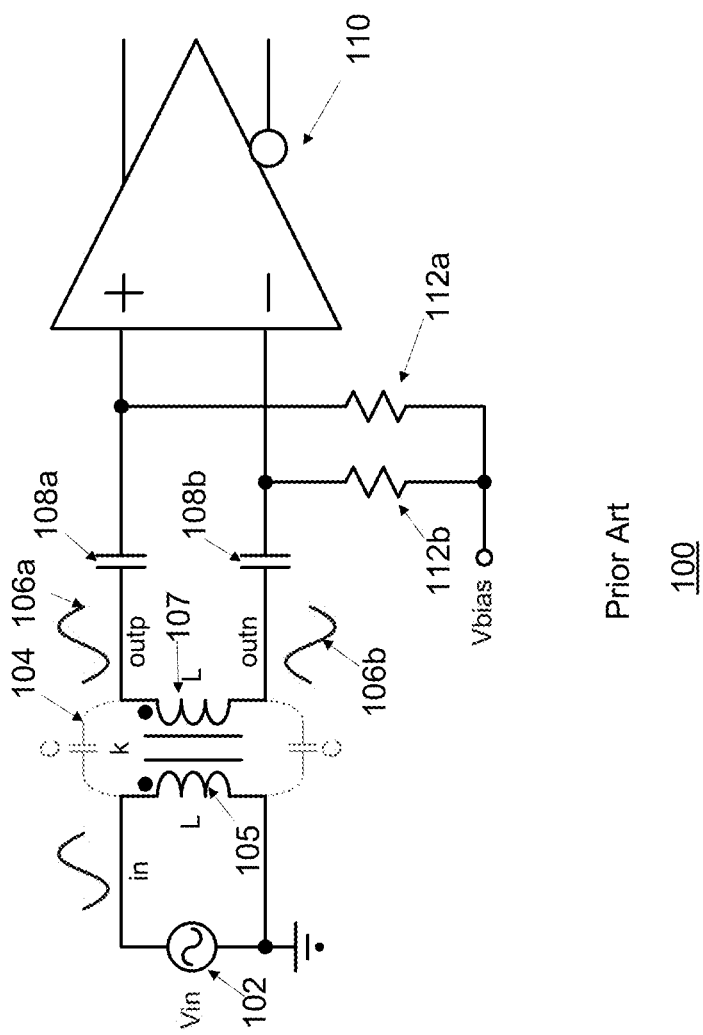
FIG. 1 illustrates a first conventional embodiment of a circuit to perform single-ended to differential conversion at a high frequency for example at greater than 1 GHz.

FIG. 1 illustrates a first conventional embodiment of a circuit 100 to perform single-ended to differential conversion at a high frequency for example at greater than 1 GHz. The circuit 100 includes a single ended signal being provided at the front end by signal source 102. The signal is provided to transformer 104. Transformer 104 comprises input coil 105 and output coil 107. The transformer 104 provides differential output signals 106a and 106b which are positive and negative respectively and also 180 degrees out of phase with each other. The signals 106a and 106b are coupled to capacitors 108a and 108b, respectively. The capacitors are coupled to an amplifier 110. A DC bias voltage is provided to both of the inputs of the amplifier 110 via resistors 112a and 112b, respectively. Circuit 100 is very sensitive to parasitic capacitance between outputs to inputs, because the output will see the unbalanced impedance at its inputs. This sensitivity limits the use of circuit 100 at high frequency (>1 GHz).

Figure 2:
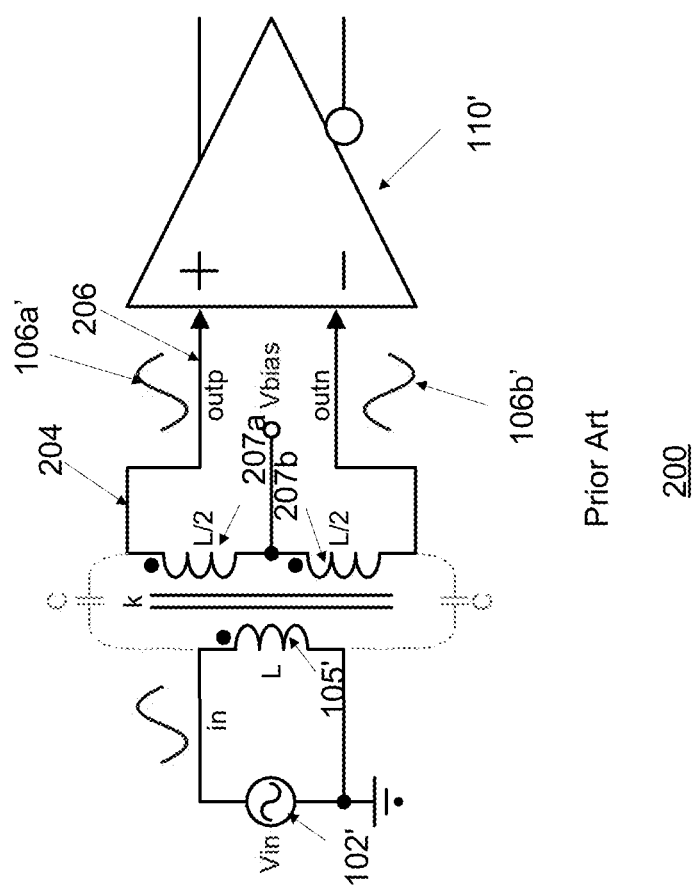
FIG. 2 illustrates a second conventional embodiment of a circuit to perform single-ended to differential conversion at high frequency.

FIG. 2 illustrates a second conventional embodiment of a circuit 200 to perform single ended to differential conversion at high frequency. Similar elements have the same reference numbers as in FIG. 1. In this embodiment, the signal source 102''' provides a signal to the transformer 204. On the output end of the transformer 204 there are two coils 207a and 207b with a center tap 206 therebetween. The center tap 206 provides the signal to bias the amplifier 110''. Both circuits 200 and 300 magnetically couple current from single-ended side (input side) to differential-output side.

Figure 3:
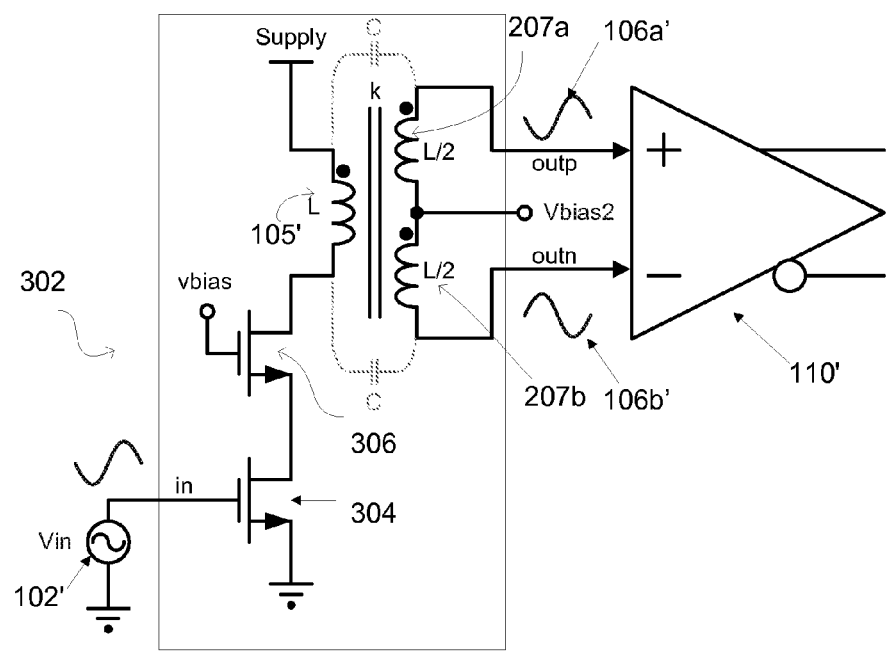
FIG. 3 illustrates a third conventional embodiment of a circuit to perform single ended to differential conversion at high frequency.

FIG. 3 illustrates a third conventional embodiment of a circuit 300 to perform single ended to differential conversion at high frequency. Similar elements have the same reference numbers as in FIG. 2. This embodiment is similar to FIG. 2 but includes a single ended amplifier 302 on the front end of the circuit 300. The amplifier 302 comprises a first transistor 304. The transistor 304 is coupled to the transistor 306. The transistor 306 is coupled to the input coil 105' of the transformer 204 and is also coupled to a bias voltage. Transistor 304 and 306 form cascode transconductance stage which outputs current to coil 105' of the transformer 204.

The circuits 200 and 300 show good single-ended to differential conversion, for the same parasitic capacitances applied to the structure, CMRR is still good for the frequency below 4 GHz. The conceptual simulation shows larger than 100 dB of CMRR, which is not really meaningful since random mismatch among components will limit CMRR to be below 60 dB. However, due to the center tap 206 these types of circuits require an additional coil 207a on the output side of the transformer 204 to provide for this performance. Accordingly what is needed is a circuit that provides for good single ended to differential conversion but is the same or smaller in size than existing solutions.

Figure 4:
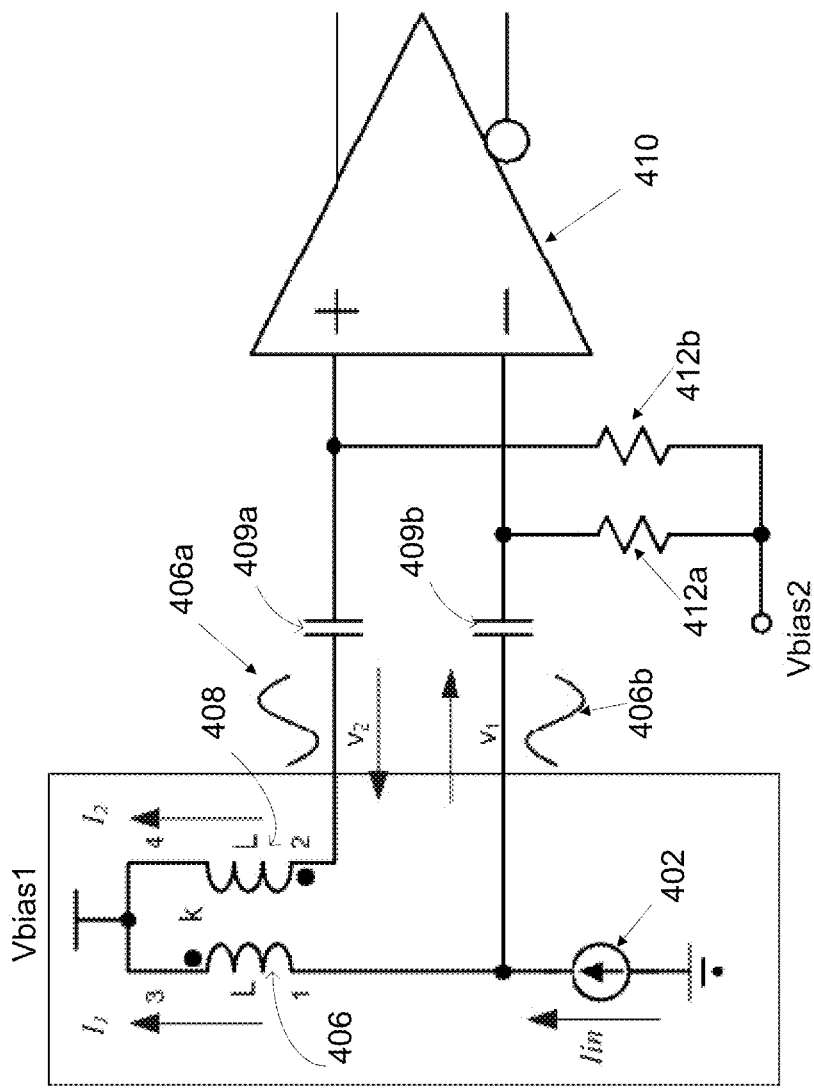
FIG. 4 shows a diagram of a circuit in accordance with the present invention.

FIG. 4 shows a diagram of a circuit 400 in accordance with the present invention. The circuit includes a transformer 402 that includes the inductors 406 and 408. The two inductors 406 and 408 include four specified ports 1-4. A single-ended signal is inputted to port 1 of the transformer 402. In this embodiment the differential outputs are generated at port 1 and port 2 with a 180 degree phase shift. Port 3 and Port 4 are both connected to Vbias1. The coupling factor between the two inductors 406 and 408 is k, mutual inductance is M=k$\sqrt{L_1 L_2}$.

It is known that a high common mode rejection ratio (CMRR) is desirable to ensure good performance in single ended to differential conversion. Accordingly, the mutual inductance is a dominating factor when determining CMRR for circuit 400. It has been determined that the bandwidth of the single-ended to differential conversion circuit 400 is very wide, and insensitive to parasitic capacitance of the structure.

Figure 5:
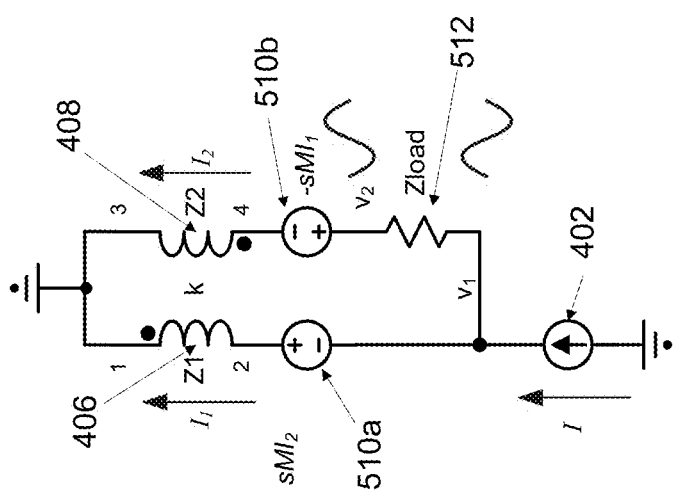
FIG. 5 shows a diagram of the circuit of FIG. 4 when applying a small signal analysis.

FIG. 5 shows a diagram of FIG. 4 when applying a small signal analysis. The inductors 406 and 408 are mutually-coupled inductors, with coupling factor k. The impedance of $L_1$ and $L_2$ are $Z_1$ and $Z_2$ respectively. The dot depicted on inductor symbol is widely used to represent the direction of two-inductor winding. One current flowing into one dot should have a current flowing out from the other dot, assuming there is no leakage inductance.

Current I is inputted to port 1 of inductor 406 and the current $I_1$ is magnetically-coupled to the other inductor 408. Based on electrical principles, I is summation of $I_1$ and $I_2$. $V_1$ and $V_2$ are the differential output signals across Zload 512. $V_1$ is phase-shifted by effective impedance of inductor 406. $V_2$ is phase-shifted by effective impedance of inductor 408 and by the phase shift of the current due to designated direction of magnetic coupling. The phase difference between $V_1$ and $V_2$ is the summation of phase difference of effective impedance of inductors 406 and 408 and the phase difference of $I_1$ and $I_2$. The effective impedance (complex number) of inductor 406 is defined as $V_1$ divided by $I_1$. The effective impedance (complex number) of inductor 408 is defined as $V_2$ divided by $I_2$.

As before mentioned in FIG. 5, inductors 406 and 408 are two coupled inductors with finite Q factor. The equation for determining the common mode rejection ratio (CMRR) is the following CMRR=Differential gain/Common-mode gain Small signal analysis shows:

$$v_1 = Z_1 I_1 - sMI_2 \qquad \text{E 1}$$

$$v_1 = (Z_{Load} + Z_2)I_2 - sMI_1 \qquad \text{E 2}$$

$$v_2 = Z_2 I_2 - sMI_1 \qquad \text{E 3}$$

, where s is Laplace domain, $M = k\sqrt{L_1 L_2}$

From E 1, E 2:

$$Z_1 I_1 - sMI_2 = (Z_{Load} + Z_2)I_2 - sMI_1 \qquad \text{E 4}$$

$$\frac{I_1}{I_2} = \frac{Z_{load} + Z_2 + sM}{Z_1 + sM}$$

From current distribution:

$$I_1 = \frac{Z_{load} + Z_2 + sM}{Z_x} \cdot I \qquad \text{E 5}$$

$$I_2 = \frac{Z_1 + sM}{Z_x} \cdot I, \qquad \text{E 6}$$

where $Z_x = Z_{load} + Z_1 + Z_2 + 2 \cdot sM$

The output swings can be obtained by E 1, E 3:

$$v_1 = \qquad \text{E 7}$$
$$Z_1 \frac{Z_{load} + Z_2 + sM}{Z_x} \cdot I - sM \frac{Z_1 + sM}{Z_x} \cdot I = \frac{Z_1 Z_{load} + Z_1 Z_2 + s^2 M^2}{Z_x} \cdot I$$

$$v_2 = Z_2 \frac{(Z_1 + sM)}{Z_x} \cdot I - sM \frac{Z_{load} + Z_2 + sM}{Z_x} \cdot I = \qquad \text{E 8}$$
$$\frac{Z_1 Z_2 - sMZ_{load} - s^2 M^2}{Z_x} \cdot I$$

Let Z1=Z2 for single-ended to differential operation. Rewrite E 7, E 8:

$$v_1 = \frac{Z_1 Z_{load} + Z_1^2 - s^2 M^2}{Z_x} \cdot I \qquad \text{E 9}$$

$$v_2 = \frac{Z_1^2 - sMZ_{load} - s^2 M^2}{Z_x} \cdot I \qquad \text{E 10}$$

$$CMRR = 2 \frac{v_1 - v_2}{v_1 + v_2} = \frac{2(Z_1 Z_{load} + sMZ_{load})}{Z_1 Z_{load} - sMZ_{load} + 2Z_1^2 - 2s^2 M^2} \qquad \text{E 11}$$

E 9, E 10, E 11 are generic derivatives of the invention. All impedances in these equations can be substituted by any complex number at any frequency. Assume input impedance of stage of the amplifier 410 is R, $Z_1 = Z_2 = sL$, $M = kL$:

$$v_1 = \frac{(1 - k^2)s^2 L^2 + sLR}{R + 2(1 + k)sL} \cdot I \qquad \text{E 12}$$

$$v_2 = \frac{(1 - k^2)s^2 L^2 - sLR}{R + 2(1 + k)sL} \cdot I \qquad \text{E 13}$$

$$CMRR = \frac{2(1 + k)sLR}{(1 - k)sLR + 2(1 - k^2)s^2 L^2} = \frac{1}{(1 - k)\left(\frac{1}{2(1 + k)} + \frac{sL}{R}\right)} \qquad \text{E 14}$$

From equation E 14 it can be seen that CMRR will be infinite if the coupling factor k=1.

The above analysis shows that the circuit 400 is insensitive to the imbalance of loading at differential outputs, since the differential conversion is decided by coupling factor k only.

When the frequency is close to zero Hz, the phase shift between $I_1$ and $I_2$ is close to 90 degree, and the phase shift between effective impedance of $L_1$ and $L_2$ is close to 90 degree, thus current (I) multiplied by impedance (Z) forms a 180 degree phase shift in differential voltage (V). This is the key difference compared to traditional approaches. In the traditional approaches the 180 degree phase shift is provided completely via the magnetically coupled current. In the circuit of FIG. 4 when the operating frequency increases, the phase difference of $I_1$ and $I_2$ reduces, the phase difference between effective impedance of $L_1$ and $L_2$ increases due to mutual coupling. Therefore the 180 degree shift in voltage is still maintained. Accordingly, the bandwidth of the 180 degree phase shift of the differential voltage outputs is very wide (>10 GHz) utilizing a system and method in accordance with the present invention, which allows for good CMRR to suppress even order harmonics.

Figure 6:
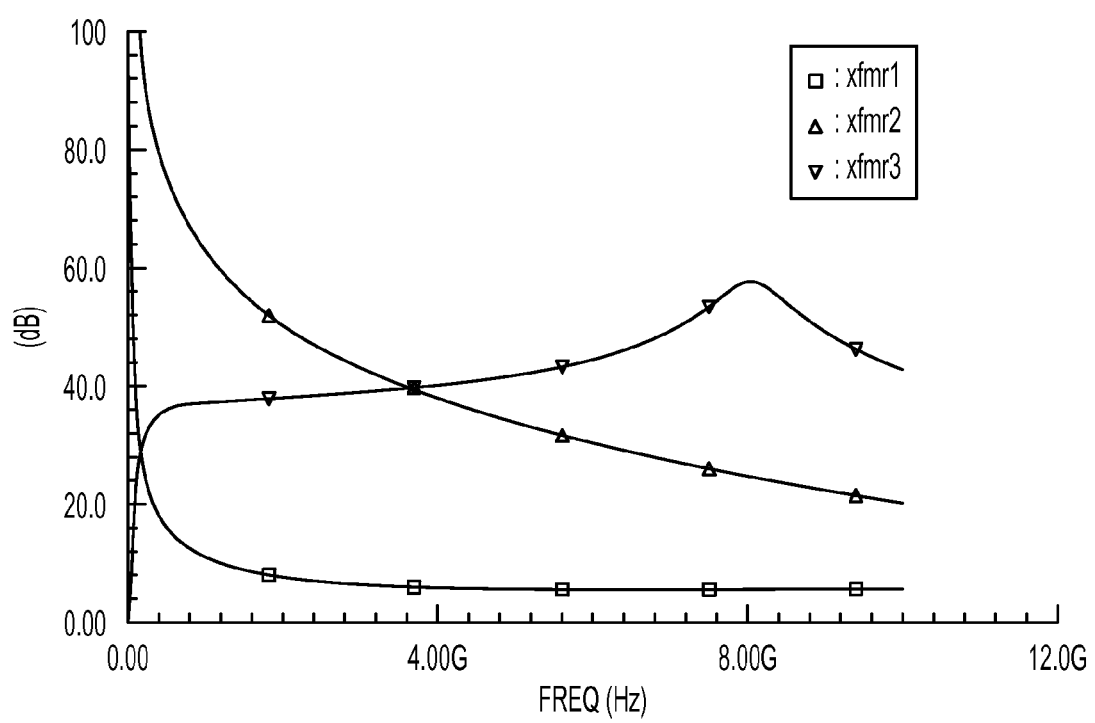
FIG. 6 is a plot that illustrates the characteristic of three circuit embodiments in Common-mode rejection ratio (CMRR).

FIG. 6 is a plot that illustrates the characteristic of three circuit embodiments:
xfmr1: FIG. 1
xfmr2: FIG. 2
xfmr3: FIG. 4

CMRR (common-mode rejection ratio)=Differential gain/Common-mode gain=2 (outp−outn)/(outp+outn)

Assume L=10 nH, series R=1Ω, with finite magnetic coupling factor K=0.95.

|       | Voltage Gain | CMRR @ 2 GHz | CMRR @ 10 GHz |
|-------|--------------|--------------|---------------|
| xfmr1 | −1.1         | 11           | 6             |
| xfmr2 | 1.9          | 50           | 20            |
| xfmr3 | 5.0          | 40           | 40            | xfmr1 shows worst single-ended to differential conversion since CMRR is poor. xfmr1 is very sensitive to parasitic capacitance between outputs to inputs, because the output will see the imbalanced impedance at inputs. This sensitivity limits the use of xfmr1 at high frequency (>1 GHz).

xfmr2 shows good single-ended to differential conversion, for the same parasitic capacitances applied to the structure, CMRR is still good for the frequency below 4 GHz. The conceptual simulation shows larger than 100 dB of CMRR at low frequency, which is not really meaningful since random mismatch among components will limit CMRR to be below 60 dB.

A circuit in accordance with the present invention has larger than 40 dB of CMRR over very wide bandwidth. The circuit is not sensitive to the parasitic between ports since those capacitors are in differential mode. In addition, the parasitics across outp and outn do not affect differential balance.

The die area comparison between the three approaches is xfmr1:xfmr2:xfmr3=1:4:1. A circuit in accordance with the present invention has outstanding performance to die-area ratio. This circuit can be implemented in a variety of embodiment and environments.

Figure 7:
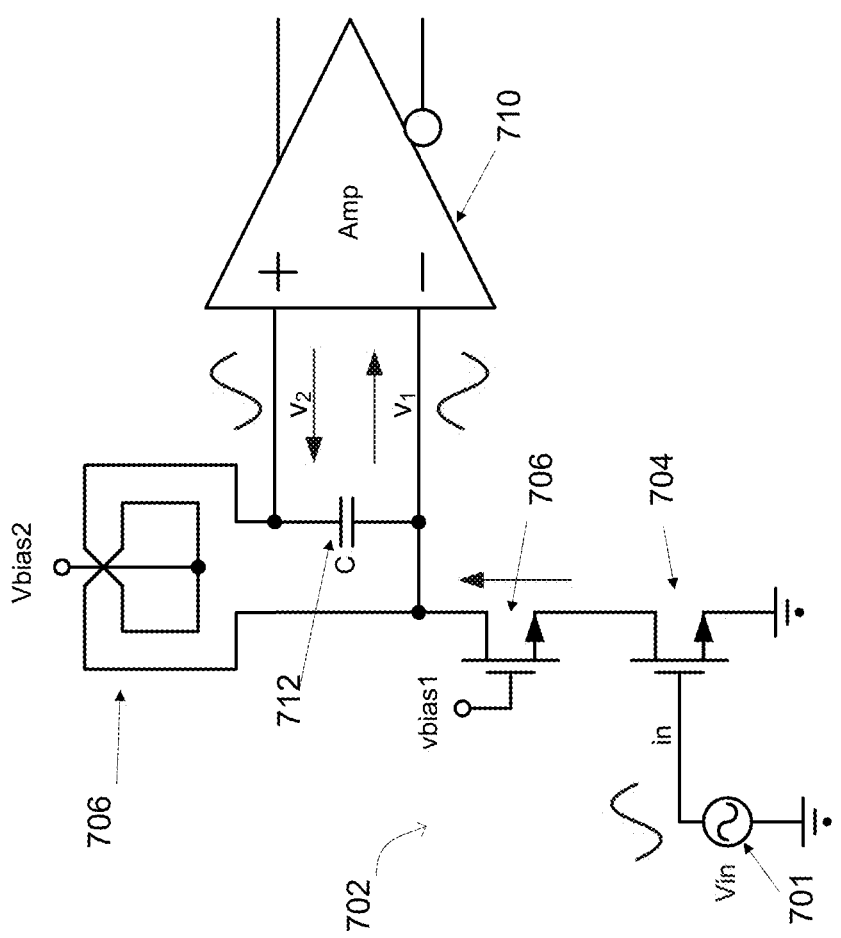
FIG. 7 is a first implementation of a circuit in accordance with the present invention.

FIG. 7 is a first implementation of a circuit 700 in accordance with the present invention. The current source can be replaced with a standard single-ended cascode transconductance stage amplifier 702. The amplifier 702 includes a transistor 704 coupled to the voltage source 701 and a second transistor coupled to the first transistor and the transformer 706. The transformer in this embodiment is replaced with a standard symmetric inductor 706. Port 3 and Port 4 of the symmetric inductor 706 are connected to the power supply as common bias reference for differential outputs. A capacitor 712 across outp and outn is optional to increase the resonance impedance of the tank, and obtain more conversion gain.

Figure 8:
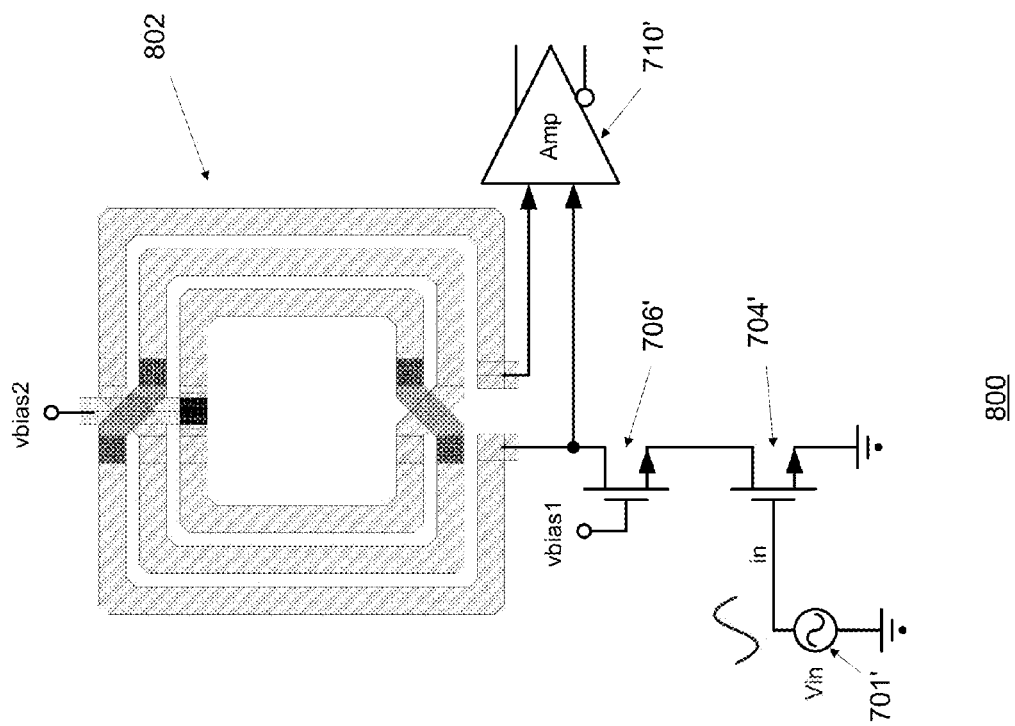
FIG. 8 is a second implementation of a circuit in accordance with the present invention.

FIG. 8 is a second implementation of a circuit 800 in accordance with the present invention. In this embodiment, an on-chip implementation of the transformer 802 is provided.

Accordingly, various embodiments of a circuit for single ended to differential conversion are disclosed. In the various embodiments, the first and second inductors of the transformer in the circuits are mutually coupled. When the operating frequency of the circuit changes, a phase difference of currents flowing through the inductors changes, and therefore a phase difference between effective impedance of the first and second inductors changes to maintain a substantially 180 degree phase difference due to the mutual coupling. Compared to conventional circuits, a circuit in accordance with an embodiment offers less front-end loss and smaller device size within a certain area. Furthermore, the circuit is relatively insensitive to parasitic at transformer outputs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A circuit comprising:
a source for providing a single ended signal; and
a transformer for receiving the single ended signal; the transformer including first and second inductors; wherein the first and second inductors are mutually coupled; wherein when an operating frequency changes, a phase difference of currents flowing through the inductors changes, and therefore a phase difference between effective impedance of the first and second inductors changes to maintain a substantially 180 degree phase difference due to the mutual coupling, wherein the first inductor includes a first specified port coupled to one end of the first inductor and a third specified port at an opposite end of the first inductor; wherein the second inductor includes a second specified port coupled to one end of the second inductor and a fourth specified port at an opposite end of the second inductor; wherein the single-ended signal is inputted to the first specified port, wherein differential outputs are generated at the first specified port and the second specified port with a 180 degree phase shift, wherein third and fourth specified ports are connected to a first bias voltage.

2. The circuit of claim 1 wherein the transformer comprises a symmetric inductor.

3. The circuit of claim 1 wherein the transformer comprises an on chip transformer.

4. The circuit of claim 1 which includes a single ended amplifier coupled between the source and the transformer for providing an amplified single ended signal to the transformer.

5. A method comprising:
providing a single ended signal; and
receiving the single ended signal by a transformer, wherein the transformer includes first and second inductors such that when an operating frequency changes, a phase difference of currents flowing through the inductors changes, and therefore a phase difference between effective impedance of the first and second inductors changes to maintain a substantially 180 degree phase difference, wherein the first inductor includes a first specified port coupled to one end of the first inductor and a third specified port at an opposite end of the first inductor; wherein the second inductor includes a second specified port coupled to one end of the second inductor and a fourth specified port at an opposite end of the second inductor; wherein the single-ended signal is inputted to the first specified port, wherein differential outputs are generated at the first specified port and the second specified port with a 180 degree phase shift, wherein third and fourth specified ports are connected to a first bias voltage.

6. The method of claim 5, wherein the transformer comprises a symmetric inductor.

7. The method of claim 5. wherein the transformer comprises an on chip transformer.

8. The method of claim 5, further comprising, amplifying the single ended signal before receiving the single ended signal by the transformer.

\* \* \* \* \*